(12) United States Patent
Edwards

(10) Patent No.: US 7,376,852 B2
(45) Date of Patent: May 20, 2008

(54) METHOD FOR CONTROLLING POWER CHANGE FOR A SEMICONDUCTOR MODULE

(75) Inventor: David L. Edwards, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 399 days.

(21) Appl. No.: 10/700,989

(22) Filed: Nov. 4, 2003

(65) Prior Publication Data

US 2005/0097379 A1 May 5, 2005

(51) Int. Cl.
*G06F 1/00* (2006.01)

(52) U.S. Cl. .................. 713/323; 713/310; 713/322; 713/324; 713/330; 713/340; 438/48; 438/54; 438/118; 438/612

(58) Field of Classification Search ........ 713/300–340; 438/48–51, 54, 55, 118–122, 612
See application file for complete search history.

(56) References Cited

U.S. PATENT DOCUMENTS

| | | | |
|---|---|---|---|
| 5,406,440 A | 4/1995 | Wieloch | |
| 5,454,114 A | 9/1995 | Yach et al. | |
| 5,552,637 A * | 9/1996 | Yamagata | ................. 257/717 |
| 5,956,563 A * | 9/1999 | Klink et al. | ................. 438/5 |
| 6,029,006 A * | 2/2000 | Alexander et al. | .......... 713/323 |
| 6,069,793 A | 5/2000 | Maruyama et al. | |
| 6,266,242 B1 | 7/2001 | Maruyama et al. | |
| 6,396,169 B1 | 5/2002 | Voegeli et al. | |
| 6,429,706 B1 | 8/2002 | Amin et al. | |
| 6,448,672 B1 | 9/2002 | Voegeli et al. | |
| 6,510,525 B1 | 1/2003 | Nookala et al. | |
| 6,593,662 B1 * | 7/2003 | Pu et al. | ..................... 257/777 |
| 6,731,012 B1 * | 5/2004 | Brodsky et al. | ............ 257/778 |
| 6,919,627 B2 * | 7/2005 | Liu et al. | ..................... 257/686 |
| 7,000,130 B2 * | 2/2006 | Adachi | ....................... 713/322 |
| 2003/0023889 A1 * | 1/2003 | Hofstee et al. | ............. 713/322 |
| 2004/0006721 A1 * | 1/2004 | Getz et al. | .................. 713/600 |
| 2004/0088593 A1 * | 5/2004 | Park | ........................... 713/322 |

\* cited by examiner

*Primary Examiner*—Rehana Perveen
(74) *Attorney, Agent, or Firm*—Kerry Goodwin; Hoffman, Warnick & D'Alessandro LLC

(57) ABSTRACT

The present invention provides a method for controlling power change for a semiconductor module. Specifically, under the present invention power is applied to, or removed from a semiconductor module between a lower power state such as a zero power, nap or sleep state and a full power state over a predetermined time period. This allows the rate of movement and strain rate of the thermal interface material within the semiconductor module to be controlled, thus preserving the reliability of the material. Typically, the power is changed over time between the lower power state and the full power state in a linear fashion or incrementally.

17 Claims, 9 Drawing Sheets

METHOD FOR CONTROLLING POWER CHANGE FOR A SEMICONDUCTOR MODULE

BACKGROUND OF THE INVENTION

1. Field of the Invention

The present invention generally relates to a method for controlling power change for a semiconductor module. Specifically the present invention provides a way to gradually apply power to or remove power from a semiconductor module so that a thermal interface therein can be preserved.

2. Related Art

As electronic devices become smaller, and operating frequencies increase, chip power density is continuing to rise. One problem associated with this advancing technology is the ability to cool high power devices with cooling technologies that are affordable and reliable. One of the biggest challenges for thermal solutions is surviving power cycling such as during powering on or off, or while entering and exiting sleep mode. Most current semiconductor modules include components that expand at different rates. This causes relative movement when there are significant thermal excursions. Since many thermal solutions include compliant thermal interface materials, one of the design parameters that should be considered is the relative movement between surfaces. With increasing chip powers, the total movement as well as the rate of movement of the thermal solution are important factors to be considered.

Heretofore, no one has adequately addressed the preservation of a thermal solution within a semiconductor module. Specifically, no previous attempts have been made to control the rate of movement of a thermal solution during power cycling.

In view of the foregoing, there exists a need for a method for controlling power change for a semiconductor module. Specifically, a need exits for a method for controlling power change between a lower power state such as a zero power, nap or sleep state and a full power state of the semiconductor module so that the thermal solution therein will be preserved.

SUMMARY OF THE INVENTION

In general, the present invention provides a method for controlling power change for a semiconductor module. Specifically, under the present invention power is applied to, or removed from a semiconductor module between a full power state and a lower power state such as a zero power, nap or sleep state over a predetermined time period. This allows the rate of movement and strain rate of the thermal interface material within the semiconductor module to be controlled, thus preserving the reliability of the material. Typically, the power is changed over time between the lower power state and the full power state in a linear fashion or incrementally (e.g., in a series of steps approximating a linear slope).

A first aspect of the present invention provides a method for controlling power change for a semiconductor module, comprising: providing a thermal interface material in the semiconductor module; providing a full power state for the semiconductor module; and changing power for the semiconductor module between a lower power state and the full power state over a predetermined time period to reduce a strain rate of the thermal interface material.

A second aspect of the present invention provides a method for applying power to or draining power from a semiconductor module, comprising: providing a thermal interface material in the semiconductor module; providing a full power state for the semiconductor module; and applying power to the semiconductor module from a lower power state to the full power state or removing power from the semiconductor module from the full power state to the lower power state over a predetermined time period to reduce a strain rate of the thermal interface material.

A third aspect of the present invention provides a semiconductor module comprising a thermal interface material, wherein power is changed for the semiconductor module between a lower power state and the full power state over a predetermined time period to reduce a strain rate of the thermal interface material.

Therefore, the present invention provides a method for controlling power change for a semiconductor module.

BRIEF DESCRIPTION OF THE DRAWINGS

These and other features of this invention will be more readily understood from the following detailed description of the various aspects of the invention taken in conjunction with the accompanying drawings in which.

Figure 1:
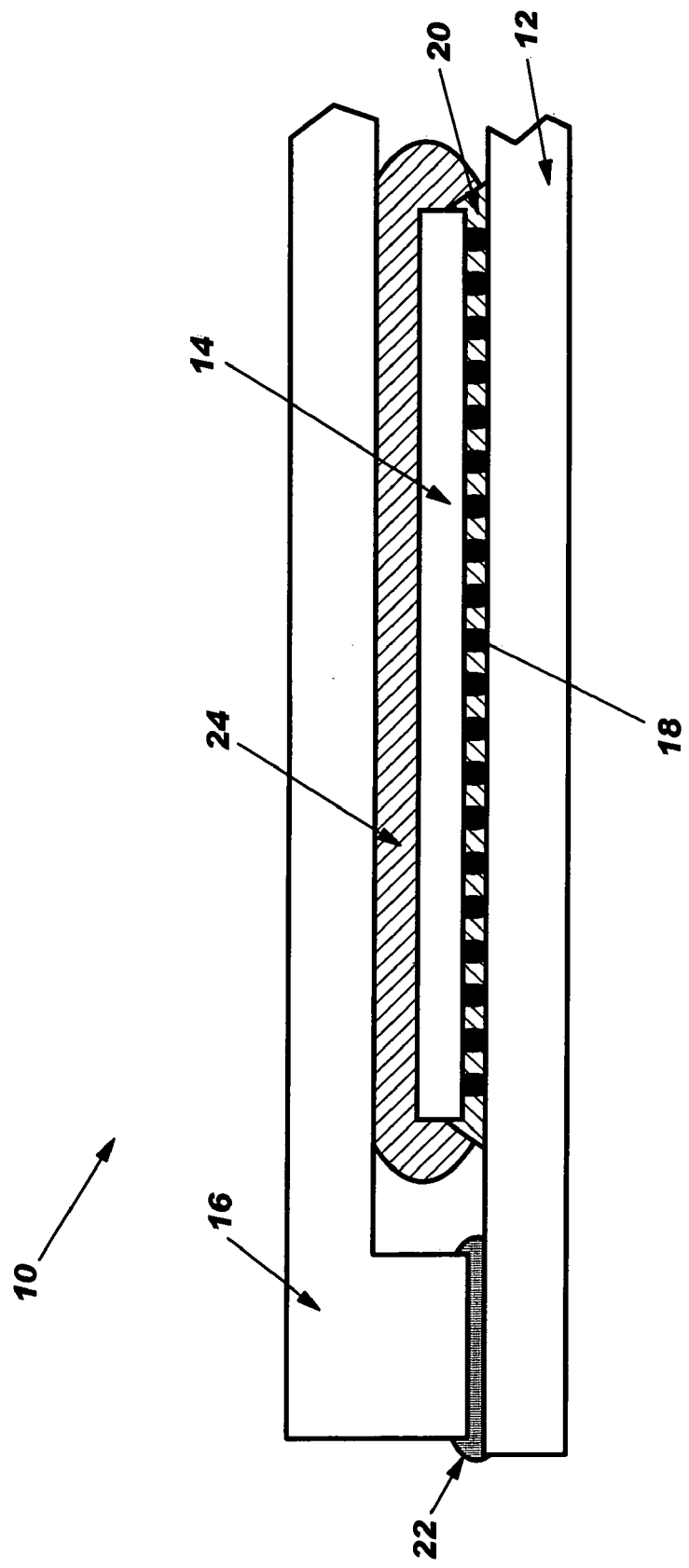
FIG. 1 depicts a semiconductor module having a thermal interface material, according to the present invention.

The drawings are merely schematic representations, not intended to portray specific parameters of the invention. The drawings are intended to depict only typical embodiments of the invention, and therefore should not be considered as limiting the scope of the invention. In the drawings, like numbering represents like elements.

DETAILED DESCRIPTION OF THE INVENTION

As indicated above, the present invention provides a method for controlling power change for a semiconductor module. Specifically, under the present invention power is applied to, or removed from a semiconductor module between a lower power state such as a zero power, nap or sleep state and a full power state over a predetermined time period. This allows the rate of movement and strain rate of the thermal interface material within the semiconductor module to be controlled, thus preserving the reliability of the material. Typically, the power is changed over time between the lower power state and the full power state in a linear fashion or incrementally (e.g., in a series of steps approximating a linear slope).

Referring now to FIG. 1, a semiconductor module 10 (hereinafter module 10) is shown. As depicted, module 10 includes chip carrier 12, chip 14 and lid 16. As known in the art, chip 14 can be attached to chip carrier 12 (e.g., which could be alumina, glass ceramic, organic, etc.) through interconnects such as solder balls 18 and/or underfill 20. However, it should be understood that underfill might not be used, especially if the seal is hermetic. Further, lid 16 can be attached to chip carrier by seal 22. As indicated above, as devices become smaller and more high powered, cooling becomes an increasing concern. To this extent, various thermal solutions have been suggested. One such solution is shown in FIG. 1 and involves the use of a thermal interface material 24.

Thermal interface material 24 can be a compliant material such as a thermal paste, or a curable material such as epoxy or other thermal adhesive. Still further, thermal interface material 24 could include thermal greases, phase change materials (PCMs), liquid metal interfaces, and metal interfaces (e.g., solder). It should be understood that the modules depicted herein such as in FIG. 1 are intended to be illustrative only and do not limit the teachings of the present invention. To this extent, thermal interface material 24 could be positioned in other locations and between components not shown herein. For example, thermal interface material 24 could be utilized between chip 14 and a heatsink or liquid cooled cold plate (not shown). In either event, the cooling component might be attached to chip carrier 12, directly attached to chip 14, or it might be connected to the card/board and only pressed against module 10.

Regardless, when implementing thermal interface material 24 in module 10, care must be taken to minimize the rate of movement thereof during power on and/or power off cycles. Specifically, as power is applied to or removed from module 10, the different components will shift in position relative to one another. Such a position shift will cause shear forces to be exhibited on thermal interface material 24. Those forces can cause thermal interface material 24 to deteriorate, which could greatly reduce the effectiveness of the thermal solution. Moreover, as power is changed, the different components could move away from or toward one another. When the surfaces move toward one another, thermal interface material 24 could flow out through gaps between the surfaces (e.g., known as oil-canning or pumping). Once thermal interface material 24 flows out in such a manner, it might not flow back in when the surfaces move back away from each other.

Figure 2:
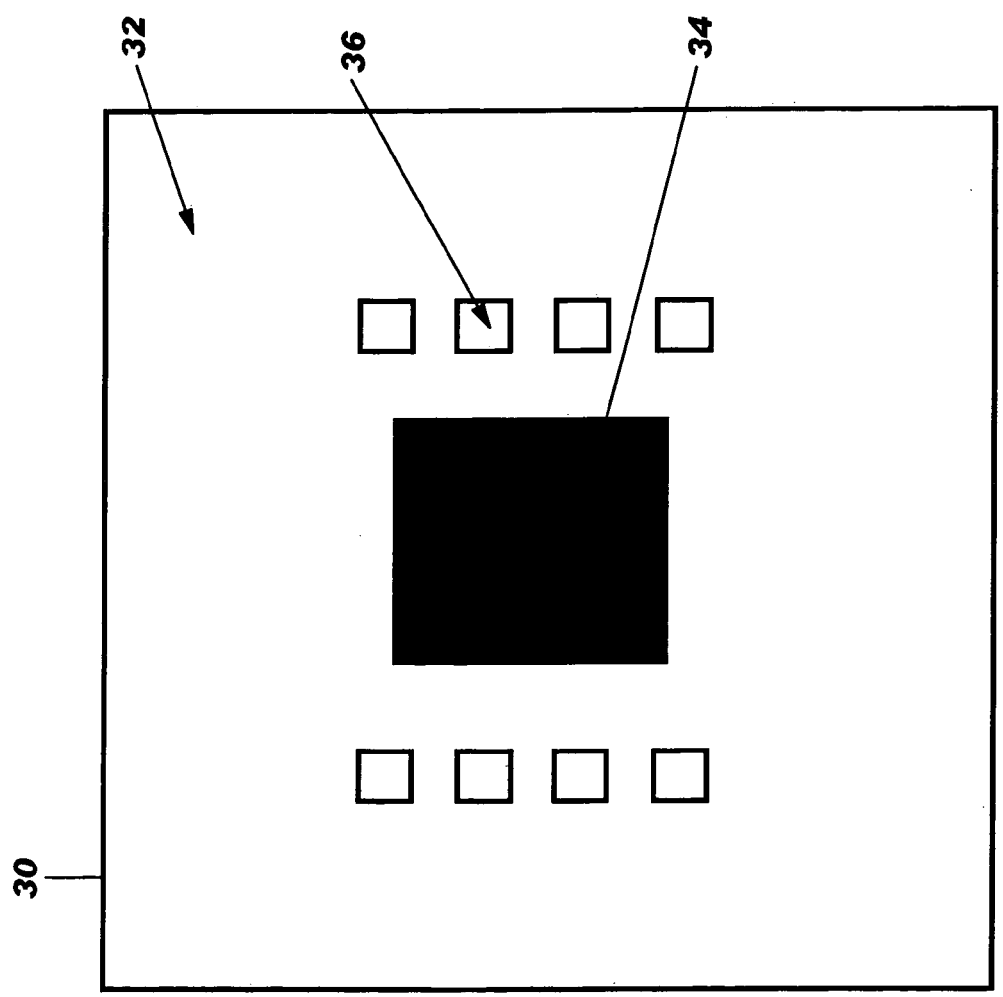
FIG. 2 depicts single chip module.
Figure 3:
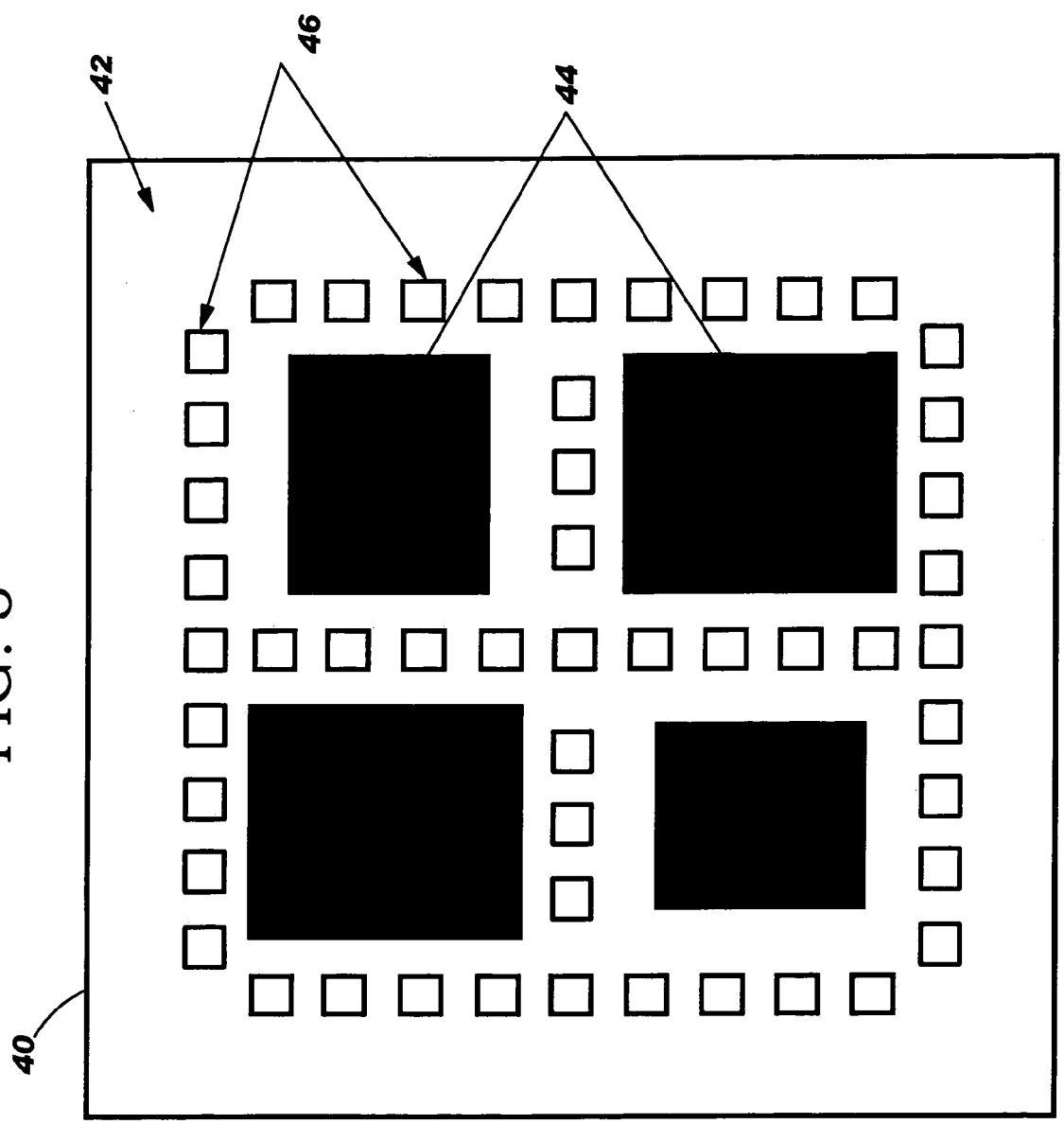
FIG. 3 depicts a multichip module.

To address this issue, the present invention provides a way to control the application or removal of power from module 10 over a predetermined time period. This, reduces the shear and/or pumping forces exerted on thermal interface material 24 and the adverse effects thereof. Before the method(s) of the present invention are disclosed in greater detail, it should be noted that the teachings herein could be implemented on a single or multichip module. For example, referring to FIG. 2, a single chip module 30 is shown. As depicted, single chip module 30 include a chip carrier 32 on which is mounted a single chip 34. Chip 34 itself is surrounded by passives 36. Conversely, referring to FIG. 3, a multichip module 40 is shown. Unlike single chip module 30 of FIG. 2, multichip module 40 provides multiple chips 44 mounted on chip carrier 42 that are each surrounded by passives 46.

Figure 4:
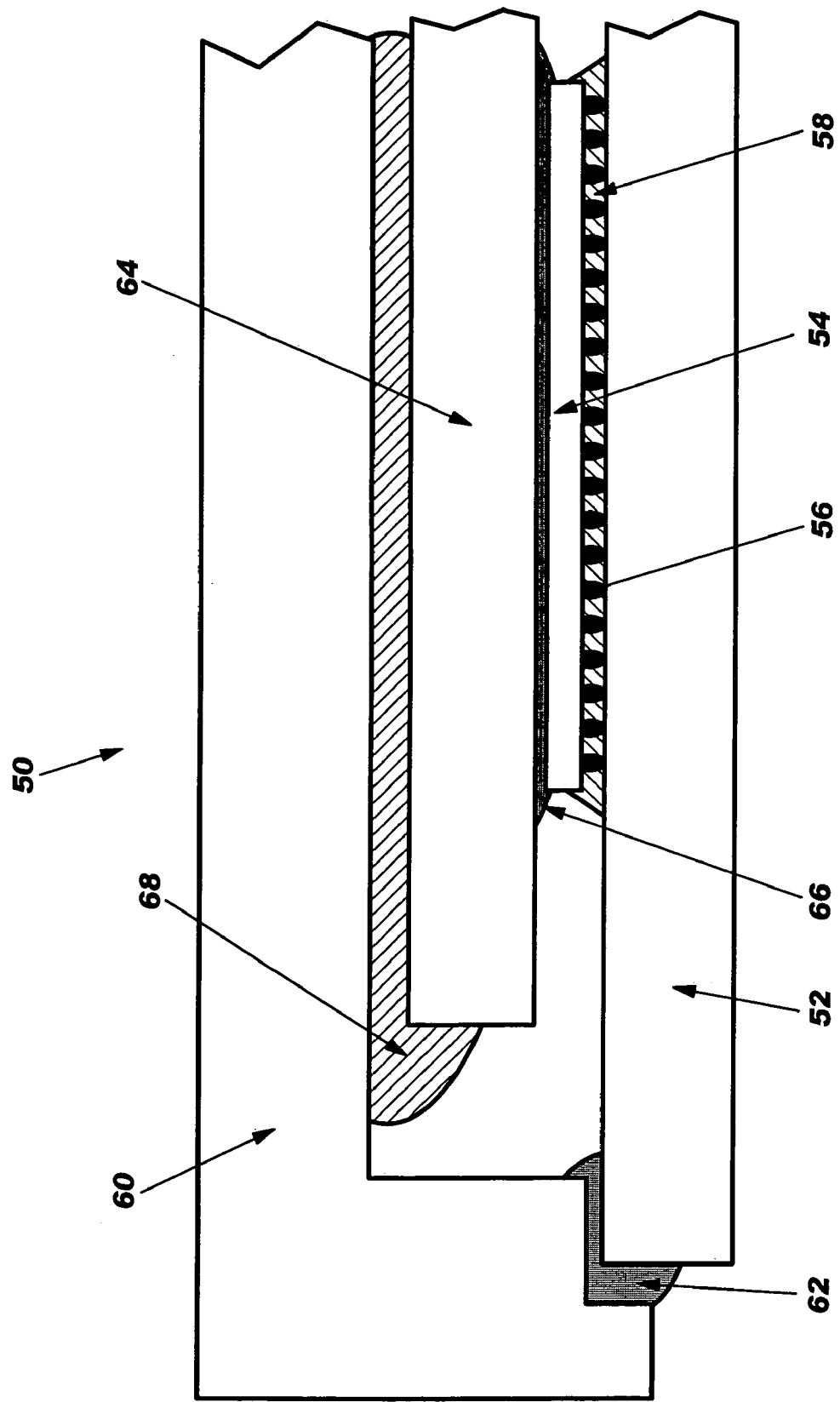
FIG. 4 depicts a semiconductor module having a thermal paste and a thermal epoxy, according to the present invention.

Regardless, it should also be understood that the present invention is not limited to modules that utilize any single type of thermal interface material. Rather, the teachings of the present invention could be implemented in conjunction with modules that utilize multiple thermal interface materials. For example, referring to FIG. 4, a multichip module 50 that uses both compliant and curable thermal interface materials is shown. As depicted, similar to module 10 of FIG. 1, multichip module 50 includes a chip 54 mounted on a chip carrier 52 via interconnects 56 and underfill 58. Lid 60 is joined to chip carrier 52 by seal 62. Unlike module 10, however, multichip module 50 includes a heat spreader 64 (e.g., silicon carbide). As shown, the interface between heat spreader 64 and chip 54 includes a thermal adhesive 66 such as a silver filled thermal epoxy. Further, the interface between lid 60 and heat spreader 64 includes thermal paste 68. Accordingly, the multichip module 50 of FIG. 4 includes both a compliant thermal interface material as well as a curable thermal interface material. Still further, an individual module could have different types of thermal interface material. For example, multichip module 50 could a high conductivity thermal paste on a high power chip, and a low conductivity thermal paste on a low power chip.

As indicated above, the present invention preserves the thermal interface material(s) used in a semiconductor module such as module 10 by applying power to, or removing power from the module over a predetermined time period. Specifically, the present invention applies power from a lower power state to a full power state, and removes power from the full power state to the lower power state over a predetermined time period so that a rapid change in temperature will not be exhibited. As a result, a rate of movement and a strain and/or pumping rate of thermal interface materials within the module will be significantly reduced. In general, changes between the lower power state and the full power state occur during off and on cycles of module 10 as well as during entry and exit of nap or sleep modes/states. The present invention is intended to cover all situations where such changes in power occur. That is, the present invention controls the changing of power between a lower power state such as a zero, nap or sleep power state and the full power state. To this extent, under the present invention, power is typically changed between the lower power state and the full power state in a linear fashion or incrementally (e.g., in a series of steps approximating a linear slope) with respect to time. In a typical embodiment, the power is changed between the lower power state and the full power state over a time span of approximately 2 minutes. However, other variations are possible. For example, the power could be changed between these power states over a time span in the range of approximately 30 seconds to 5 minutes. In another embodiment, the power could be changed over a time span in the range of approximately 1-3 minutes. These types of time spans provide substantial improvement over related art devices where power was changed over a span of milliseconds.

Figure 5:
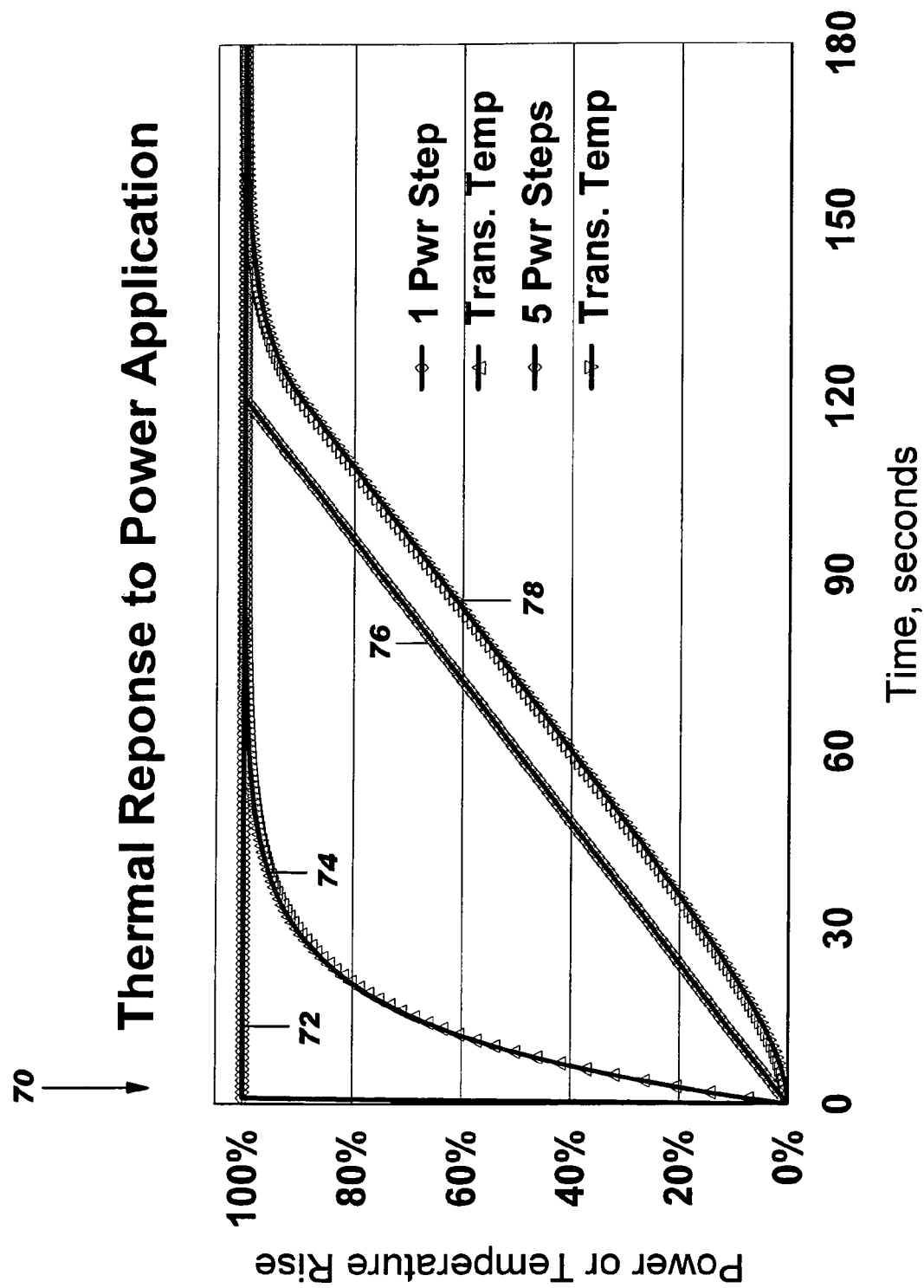
FIG. 5 depicts a graph of power application versus time for a linear application of power to a semiconductor module, according to the present invention.

Referring to FIG. 5, the linear application of power to module 10 is shown in greater detail. Specifically, FIG. 5 depicts a graph 70 of power application versus time from a zero power state to a full power state for a semiconductor module (e.g., module 10, 30, 40 or 50). Curves 72 and 74 represent an instant application of power to the semiconductor module, and the resulting transition temperature that were typically provided under the related art. As can be seen from curve 72, prior to the present invention, power was applied to a module from a zero power state to a full power state virtually instantly. As can be further seen, this resulted in a rapid/acute increase of temperature in the module. Specifically, curve 74 shows that a maximum transient temperature is reached in approximately 60 seconds. Conversely, under the present invention, curves 76 and 78 can be provided. As demonstrated by curve 76, power is applied to the module linearly over a predetermined time period. For example, curve 76 shows that the full power state is not reached until approximately 120 seconds. As a result, a maximum transient temperature is not reached until approximately 150 seconds, as shown by curve 78.

Figure 6:
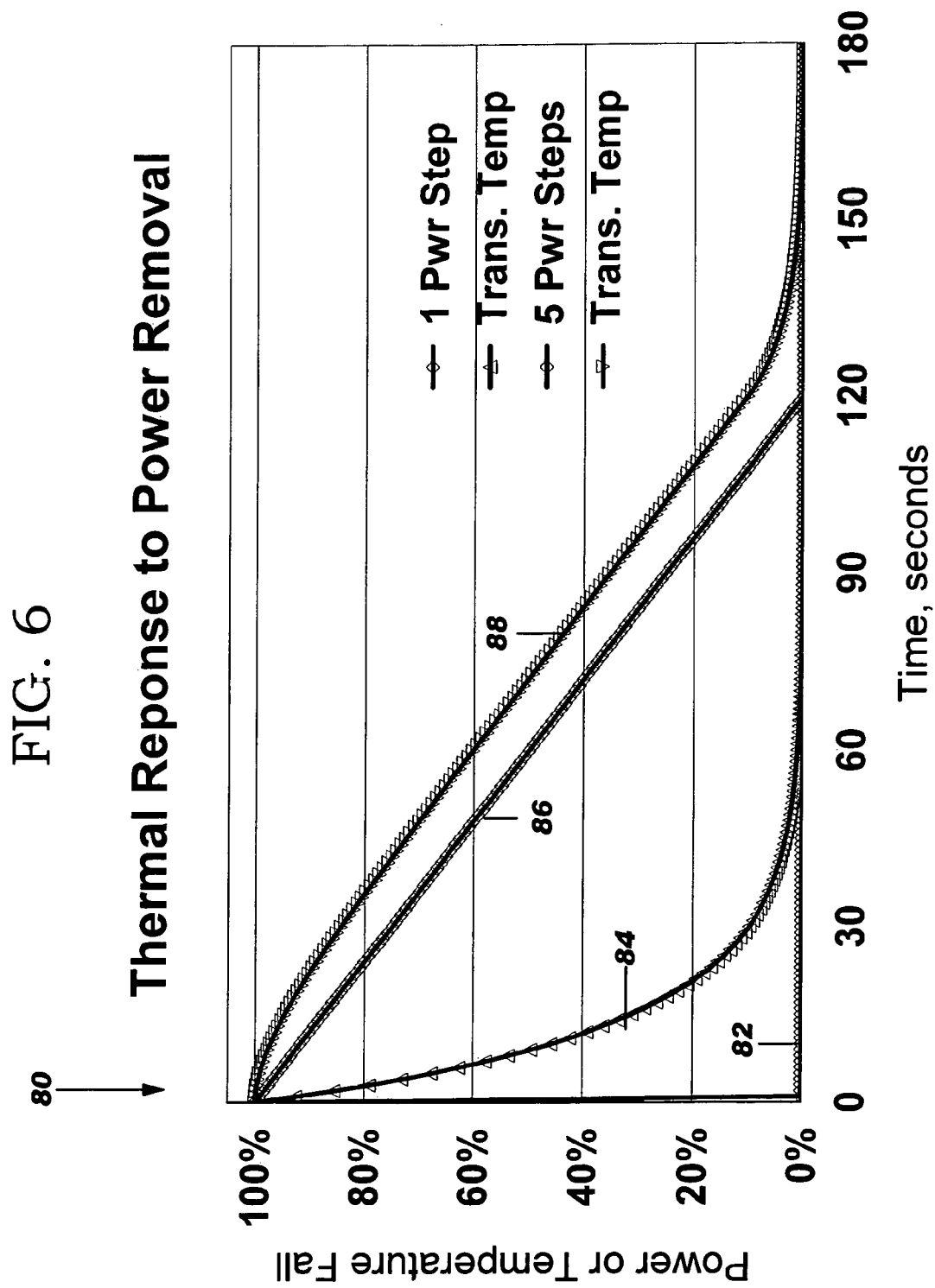
FIG. 6 depicts a graph of power removal versus time for a linear removal of power from a semiconductor module, according to the present invention.

The removal of power from the semiconductor module can occur in a similar fashion. Specifically, referring to FIG. 6, the removal of power from the full power state to the zero power state in a linear fashion is shown in graph 80. Curve 82 shows the instant removal of power between the two power states that was typical under the related art. As can be seen from curve 84, such a rapid removal of power causes a rapid drop in temperature so that a minimum transient temperature was reached in approximately 60 seconds. However, under the present invention, power can be removed in a linear fashion with respect to time as shown by curve 86. When this is done, the zero power state is not reached until approximately 120 seconds as shown by curve 86, and the minimum transient temperature is not reached until approximately 150 seconds as shown by curve 88.

Figure 7:
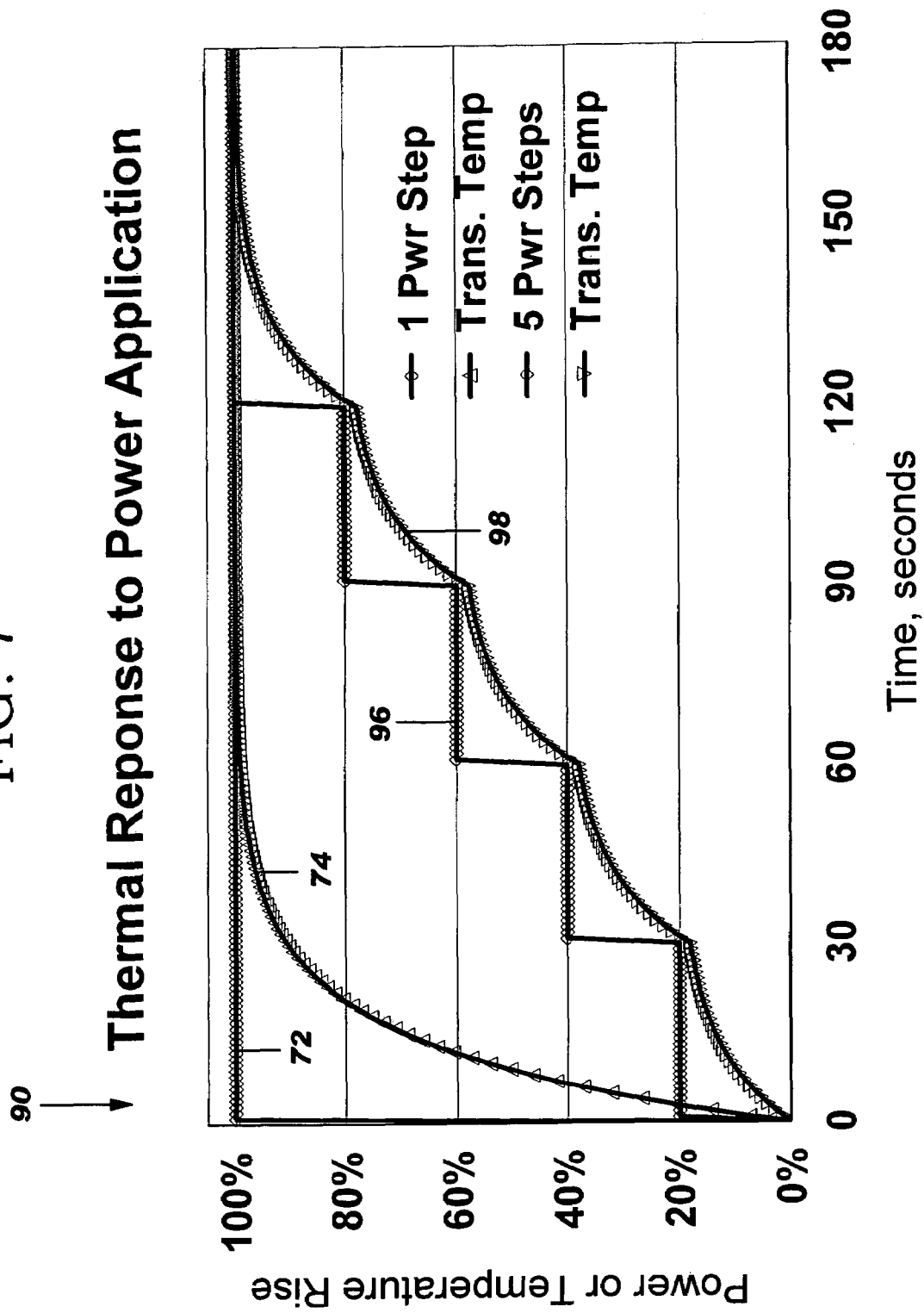
FIG. 7 depicts a graph of power application versus time for an incremental application of power to a semiconductor module, according to the present invention.

In another embodiment, power can be applied to or removed from the semiconductor module incrementally over a predetermined period of time. To this extent, FIG. 7 shows a graph 90 of power application versus time for an incremental application of power to the semiconductor module from a zero power state to a full power state. Curves 72 and 74 depict the related-art technique of instant power application and resulting transient temperature that was shown in FIG. 5. Conversely, curve 96 shows that power can be applied under the present invention in an incremental or stepping fashion with respect to time. As depicted in curve 96, the full power state is not reached until approximately 120 seconds. Further, from curve 98, it can be seen that the maximum transient temperature is not reached until approximately 150 seconds.

Figure 8:
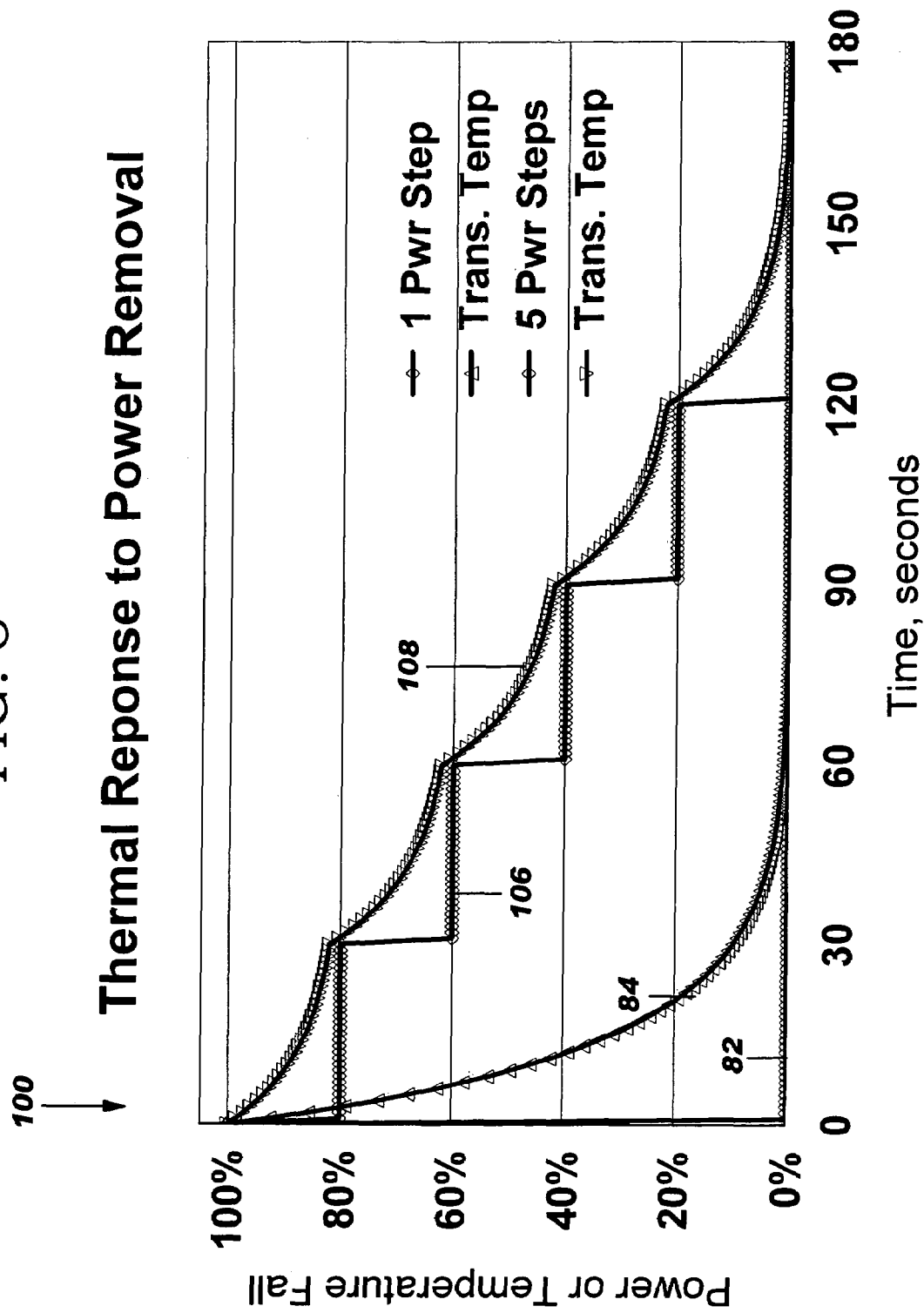
FIG. 8 depicts a graph of power removal versus time for an incremental removal of power from a semiconductor module, according to the present invention.

A similar tactic could be utilized when removing power from the semiconductor module from the full power state to the zero power state as shown in FIG. 8. Specifically, FIG. 8 shows a graph 100 of incremental power removal versus time. Curves 82 and 84 reiterate the instant power removal and resulting transient temperatures that were exhibited under the related art. Conversely, curves 106 and 108 show the removal of power incrementally over a predetermined time period and resulting transient temperatures according to the present invention. As can be seen from curve 106, the zero power state is not reached until approximately 120 seconds, while the minimum transient temperature is not reached until approximately 150 seconds as shown in curve 108.

By applying power to or removing power from the module between the zero power state and the full power state over a predetermined time period, the present invention thus reduces the rate of temperature change. This reduction causes an associated reduction in the rate of movement of thermal interface materials within the semiconductor module. As noted above, with reduced rate of movement comes reduced strain rate and improved thermal reliability. It should be understood that the time periods shown in FIGS. 5-8 for applying power to or removing power from a semiconductor module under the present invention are intended to represent only one possible illustrative embodiment. To this extent, the teachings of the present invention could be carried out over different periods of time.

Figure 9:
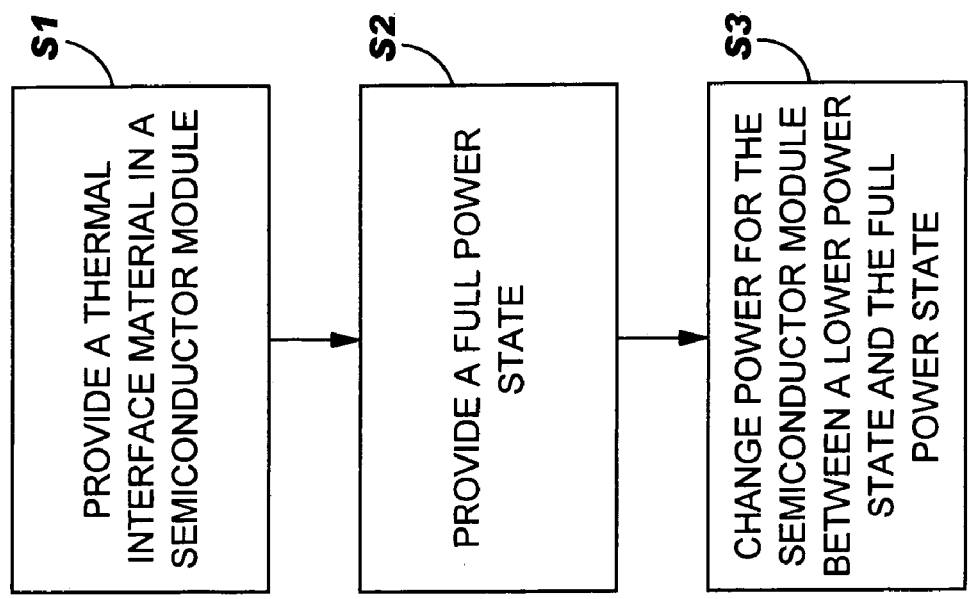
FIG. 9 depicts a method flow diagram according to the present invention.

Referring now to FIG. 9, a method flow diagram 110 according to the present invention is shown in greater detail. As depicted, first step S1 is to provide a thermal interface material in the semiconductor module. Second step S2 is to provide a full power state for the semiconductor module. Third step S3 is to change power for the semiconductor module between a lower power state and the full power state over a predetermined time period to reduce a strain rate of the thermal interface material.

The foregoing description of the preferred embodiments of this invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of this invention as defined by the accompanying claims. For example, although the detailed description discusses C4 attachment of chips in modules (e.g., also referred to as flip chips), the present invention can be utilized with any type chip attachments such as wirebond chips. In such a case, the thermal interface material is generally referred to as the die attach layer. In any event, the present invention preserves the reliability of any type of thermal interface material for any type of semiconductor module.

I claim:

1. A method for controlling power change for a semiconductor module, comprising:

providing a thermal interface material in the semiconductor module; wherein the thermal interface material is positioned between components of the semiconductor module and the thermal interface material is selected from the group consisting of: a thermal paste, a thermal adhesive, a thermal grease, a phase change material, and a liquid metal interface; wherein deterioration, or extrusion out though gaps between the components of the semiconductor module, of the thermal interface material is reduced;

providing a full power state for the semiconductor module; and directly changing power for the semiconductor module by one of applying power to the semiconductor module and reducing power from the semiconductor module between a lower power state and the full power state over a predetermined time period to reduce a strain rate of the thermal interface material.

2. The method of claim 1, wherein the changing step comprises applying power from the lower power state to the full power state over the predetermined time period to reduce the swain rate of the thermal interface material.

3. The method of claim 1, wherein the changing step comprises reducing power from the full power state to the lower power state over the predetermined time period to reduce the strain rate of the thermal interface material.

4. The method of claim 1, wherein the changing step comprises changing power in a linear fashion or incrementally between the lower power state and the full power state over the predetermined time period.

5. The method of claim 1, wherein the predetermined time period is approximately 30 seconds to 5 minutes.

6. The method of claim 1, wherein the lower power state is selected from the group consisting of a zero power state, a nap state and a sleep state, and wherein the semiconductor module is selected from the group consisting of a single chip module and a multichip module.

7. A method for applying power to or draining power from a semiconductor module, comprising:

providing a thermal interface material in the semiconductor module; wherein the thermal interface material is positioned between components of the semiconductor module and the thermal interface material is selected from the group consisting of: a thermal paste, a thermal adhesive, a thermal grease, a phase change material, and a liquid metal interface; wherein deterioration, or extrusion out through gaps between the components of the semiconductor module, of the thermal interface material is reduced;

providing a full power state for the semiconductor module; and directly applying power to the semiconductor module from a lower power state to the full power state or removing power from the semiconductor module from the full power state to the lower power state over a predetermined time period to reduce a strain rate of the thermal interface material.

8. The method of claim 7, wherein the power is applied to or removed from the semiconductor module in a linear fashion over the predetermined time period.

9. The method of claim 7, wherein power is applied to or removed from the semiconductor module incrementally over the predetermined time period.

10. The method of claim 7, wherein the lower power state is selected from the group consisting of a zero power state, a nap state and a sleep state, and wherein the semiconductor module is selected from the group consisting of a single chip module and a multichip module.

11. A semiconductor module comprising a thermal interface material, wherein the thermal interface material is positioned between components of the semiconductor module and the thermal interface material is selected from the group consisting of: a thermal paste, a thermal adhesive, a thermal grease, a phase change material, and a liquid metal interface; wherein deterioration, or extrusion out through gaps between the components of the semiconductor module, of the thermal interface material is reduced; wherein power is directly changed by one of applying power to the semiconductor module and reducing power from the semiconductor module between a lower power state and a full power state over a predetermined time period to reduce a strain rate of the thermal interface material.

12. The semiconductor module of claim 11, wherein the power is applied from the lower power state to the full power state over the predetermined time period to reduce the strain rate of the thermal interface material.

13. The semiconductor module of claim 11, wherein the power is reduced from the full power state to the lower power state over the predetermined time period to reduce the strain rate of the thermal interface material.

14. The semiconductor module of claim 11, wherein the power is changed in a liner fashion between the lower power state and the full power state over the predetermined time period.

15. The semiconductor module of claim 11, wherein the power is changed incrementally between the lower power state and the full power state over the predetermined time period.

16. The semiconductor module of claim 11, wherein the semiconductor module is selected from the group consisting of a multichip module and a single chip module.

17. The semiconductor module of claim 11, wherein the lower power state is selected from the group consisting of a zero power state, a nap state or a sleep state.

* * * * *